(12) United States Patent
Taguchi et al.

(10) Patent No.: US 11,437,554 B2
(45) Date of Patent: Sep. 6, 2022

(54) LIGHT EMITTING MODULE

(71) Applicant: NICHIA CORPORATION, Anan (JP)

(72) Inventors: Koji Taguchi, Anan (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 346 days.

(21) Appl. No.: 16/849,383

(22) Filed: Apr. 15, 2020

(65) Prior Publication Data

US 2020/0343423 A1    Oct. 29, 2020

(30) Foreign Application Priority Data

Apr. 25, 2019  (JP) .............................. JP2019-084240

(51) Int. Cl.
*H01L 33/62* (2010.01)
*H01L 33/58* (2010.01)
*H01L 25/075* (2006.01)

(52) U.S. Cl.
CPC .......... *H01L 33/62* (2013.01); *H01L 25/0753* (2013.01); *H01L 33/58* (2013.01)

(58) Field of Classification Search
CPC combination set(s) only.
See application file for complete search history.

(56) References Cited

U.S. PATENT DOCUMENTS

| | | | |
|---|---|---|---|
| 2016/0268478 A1* | 9/2016 | Tomizawa | .............. H01L 33/42 |
| 2017/0005247 A1* | 1/2017 | Maki | ..................... H01L 27/153 |
| 2018/0151788 A1 | 5/2018 | Nagahara et al. | |
| 2018/0218974 A1 | 8/2018 | Funahashi | |
| 2018/0240746 A1 | 8/2018 | Tsujita et al. | |

FOREIGN PATENT DOCUMENTS

| | | |
|---|---|---|
| JP | H04-133479 U | 12/1992 |
| JP | 2011-129646 A | 6/2011 |
| JP | 2018-093192 A | 6/2018 |
| JP | 2018-200976 A | 12/2018 |
| WO | WO-2017/018212 A1 | 2/2017 |

* cited by examiner

*Primary Examiner* — Ratisha Mehta
(74) *Attorney, Agent, or Firm* — Foley & Lardner LLP

(57) ABSTRACT

A light emitting module includes a first terminal part, a first light emitting device including a first electrode, a second light emitting device including a second electrode, a first conductive thin film including a first thin film region and a second thin film region, and a first conductive layer electrically connected to the first thin film region. The first thin film region electrically connects the first terminal part and the first electrode, and has a first current path length. The second thin film region electrically connects the first terminal part and the second electrode, and has a second current path length shorter than the first current path length. At least a portion of the first conductive layer overlaps with the first thin film region in a first direction that is perpendicular to a plane in which the first thin film region extends.

15 Claims, 11 Drawing Sheets

LIGHT EMITTING MODULE

CROSS-REFERENCE TO RELATED APPLICATION

This application claims priority to Japanese Patent Application No. 2019-084240, filed on Apr. 25, 2019, the contents of which are hereby incorporated by reference in their entirety.

BACKGROUND

The present disclosure relates to a light emitting module.

Known in the art is a light emitting module that includes a plurality of light emitting devices. The light emitting module is desired to exhibit uniform luminance (for example, see Japanese Patent Publication No. 2011-129646 A).

Certain embodiments of the present disclosure allows for providing a light emitting module with improved uniformity in luminance.

SUMMARY

According to one embodiment, a light emitting module includes a first terminal part, a first light emitting device, a second light emitting device, a first conductive thin film, and a first conductive layer. The first light emitting device includes a first electrode. The second light emitting device includes a second electrode. The first conductive thin film includes a first thin film region and a second thin film region. The first thin film region electrically connects the first terminal part and the first electrode, and has a first current path length. The second thin film region electrically connects the first terminal part and the second electrode, and has a second current path length shorter than the first current path length. The first conductive layer is electrically connected to the first thin film region. At least a portion of the first conductive layer overlaps with the first thin film region in a first direction that is perpendicular to a plane in which the first thin film region extends.

According to certain embodiments, a light emitting module with improved luminance uniformity can be obtained.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION

Figure 1:
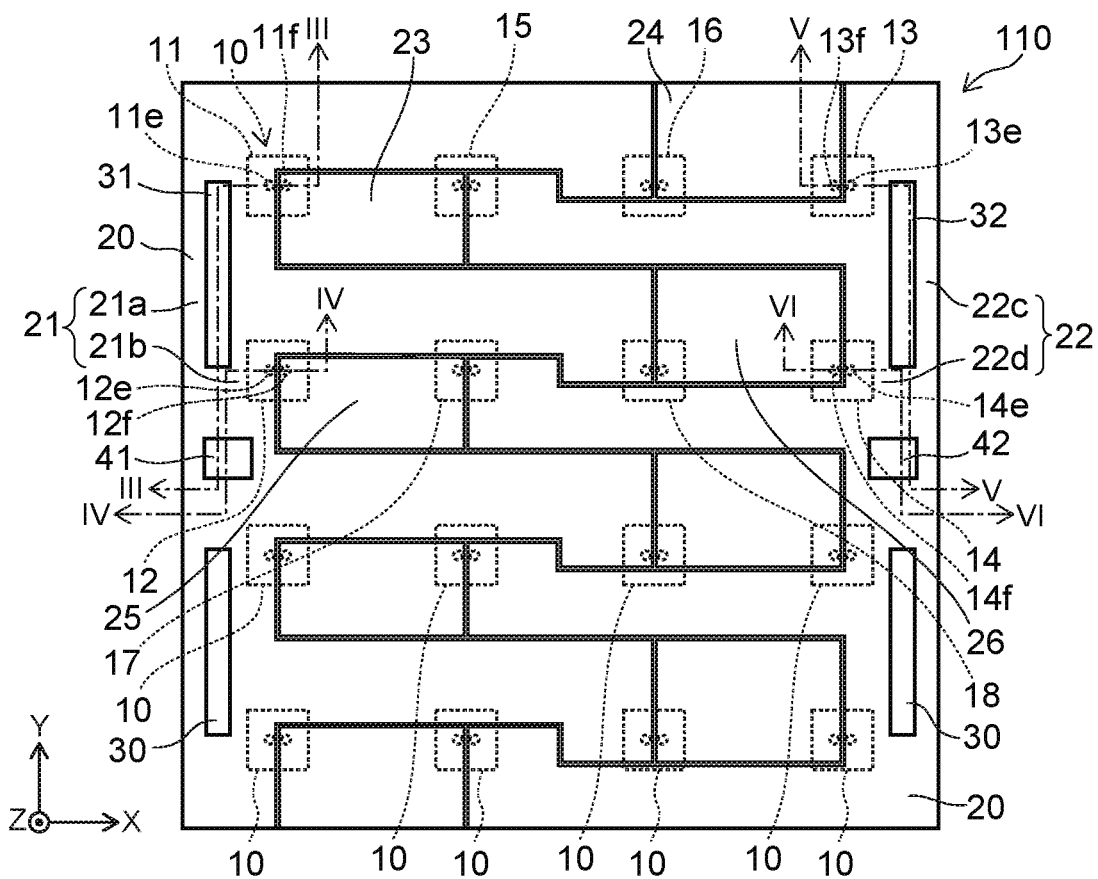
FIG. 1 is a schematic plan view showing an example of a light emitting module according to a first embodiment.

In the following, with reference to the drawings, a description will be given of embodiments of the present disclosure.

The drawings are schematic, and illustrate technical ideas. The relationship between the thickness and the width of each portion, the proportion of portions and the like may not necessarily be the same those in an actual light emitting module. An identical portion may be illustrated with different length or proportion among the drawings. In the present specification, a member similar to a member that has been described with reference to a previous drawing may be denoted by the same reference numeral, and a detailed description thereof will be omitted when appropriate.

In the present specification, the terms "perpendicular" and "parallel" encompasses not only strictly perpendicular configuration and strictly parallel configuration, but also a slight deviation from strictly perpendicular and strictly parallel due to manufacturing processes, etc. That is, the terms "perpendicular" and "parallel" encompass substantially perpendicular and substantially parallel configurations, respectively.

First Embodiment

Figure 2:
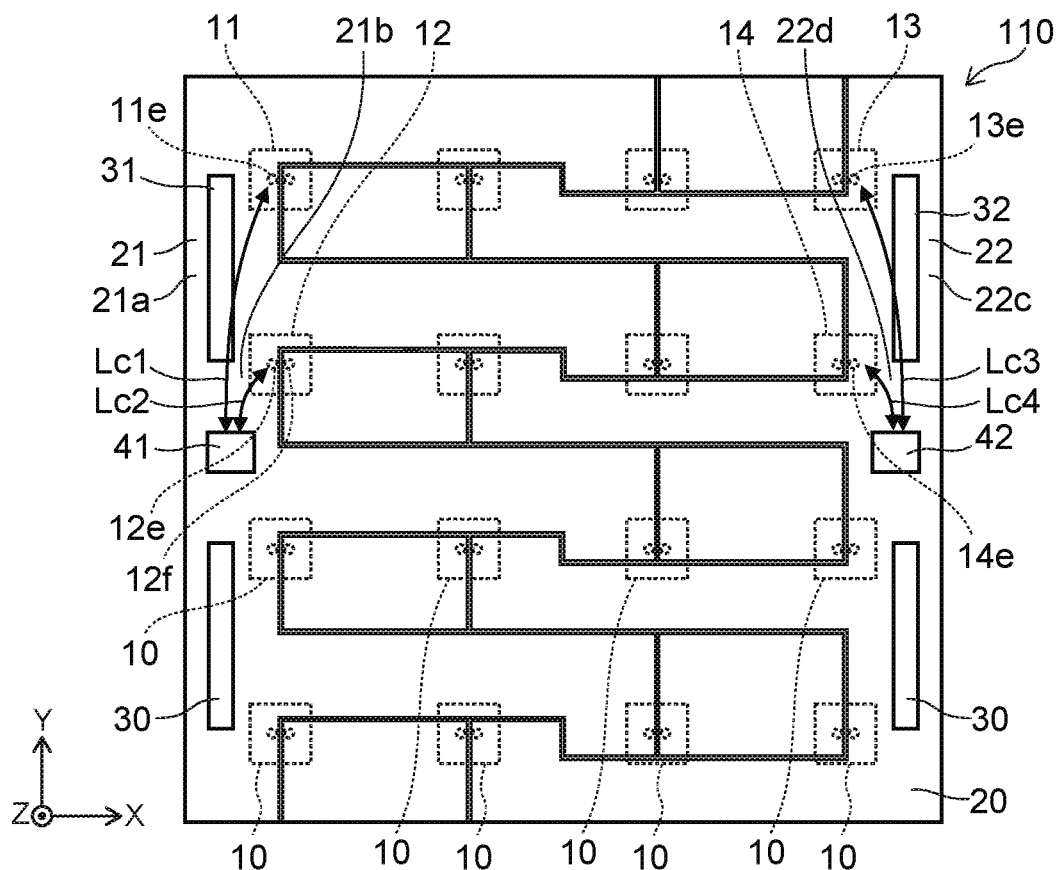
FIG. 2 is a schematic plan view showing an example of the light emitting module according to the first embodiment.

FIGS. 1 and 2 are schematic plan views showing an example of a light emitting module according to a first embodiment.

FIGS. 3 to 6 are schematic cross-sectional views showing an example of the light emitting module according to the first embodiment.

FIGS. 1 and 2 are plan views viewed in a direction indicated by an arrow AA in FIGS. 3 to 6. FIGS. 3 to 6 are respectively cross-sectional views taken along line line IV-IV, line V-V, and VI-VI in FIG. 1.

As shown in FIG. 1, a light emitting module 110 according to the first embodiment includes a first terminal part 41, a first light emitting device 11, a second light emitting device 12, a first conductive thin film 21, and a first conductive layer 31. The light emitting module 110 may further include a second terminal part 42.

For example, the light emitting module 110 includes a plurality of light emitting devices 10. The first light emitting device 11 is one of the plurality of light emitting devices 10. The second light emitting device 12 is another one of the plurality of light emitting devices 10. The light emitting module 110 may include a third light emitting device 13, a fourth light emitting device 14, a fifth light emitting device 15, a sixth light emitting device 16, a seventh light emitting device 17, an eighth light emitting device 18 and the like. These light emitting devices are included in the plurality of light emitting devices 10. Examples of other light emitting devices 10 will be described below.

Each of these light emitting devices 10 is electrically connected to the first terminal part 41 and the second terminal part 42 via corresponding ones of conductive thin films 20. In the present specification, the expression "one of the plurality of light emitting devices 10 is electrically connected to the first terminal part 41 and the second terminal part 42" encompasses a configuration in which one of the plurality of light emitting devices 10 is connected to the first terminal part 41 and the second terminal part 42 via another one of the plurality of light emitting devices 10.

In the example of the light emitting module 110 shown in FIG. 1, the first light emitting device 11 and the fifth light emitting device 15 are connected to each other in series, and are electrically connected to the first terminal part 41 and the second terminal part 42. The second light emitting device 12 and the seventh light emitting device 17 are connected to each other in series, and are electrically connected to the first terminal part 41 and the second terminal part 42. The third light emitting device 13 and the sixth light emitting device 16 are connected to each other in series, and are electrically connected to the first terminal part 41 and the second terminal part 42. The fourth light emitting device 14 and the eighth light emitting device 18 are connected to each other in series, and are electrically connected to the first terminal part 41 and the second terminal part 42. These electric connections are established by respective conductive thin films 20.

The conductive thin films 20 include the first conductive thin film 21 described above. As will be described below, the conductive thin films 20 may further include second to sixth conductive thin films 22 to 26 and the like.

For example, when voltage is applied across the first terminal part 41 and the second terminal part 42, current is supplied to the plurality of light emitting devices 10 via the conductive thin films 20, and light is emitted from a plurality of light emitting devices 10.

Examples of the first light emitting device 11 and the second light emitting device 12 will be described below.

As shown in FIG. 1, the first light emitting device 11 includes a first electrode 11e. The second light emitting device 12 includes a second electrode 12e. The first conductive thin film 21 includes a first thin film region 21a and a second thin film region 21b. The first thin film region 21a electrically connects the first terminal part 41 and the first electrode 11e. The second thin film region 21b electrically connects the first terminal part 41 and the second electrode 12e. The first thin film region 21a forms at least a portion of the current path of current flowing between the first terminal part 41 and the first electrode 11e. The second thin film region 21b forms at least a portion of the current path of current flowing between the first terminal part 41 and the second electrode 12e.

As shown in FIG. 1, the distance between the first terminal part 41 and the first electrode 11e is different from the distance between the first terminal part 41 and the second electrode 12e. The plurality of current paths have lengths different from each other.

Figure 3:
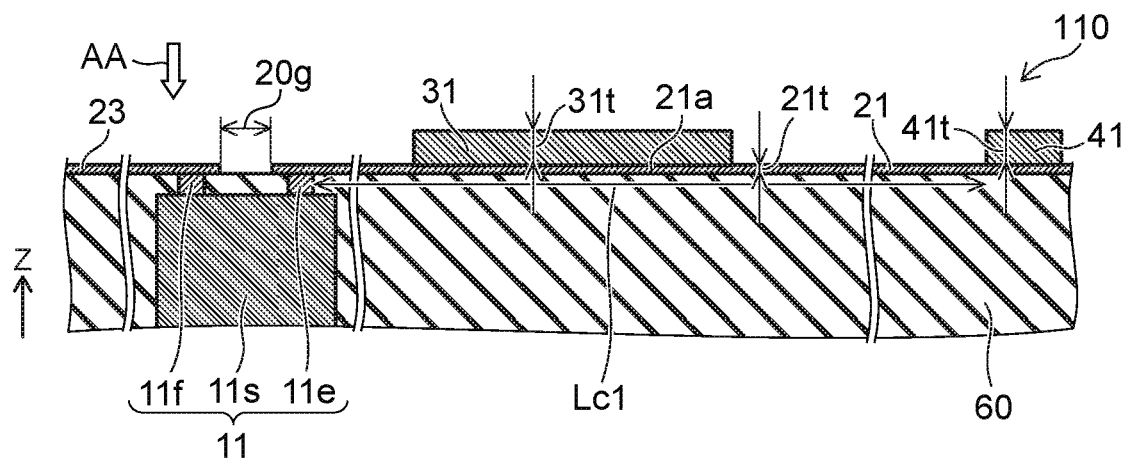
FIG. 3 is a schematic cross-sectional view showing an example of the light emitting module according to the first embodiment taken along line in FIG. 1.
Figure 4:
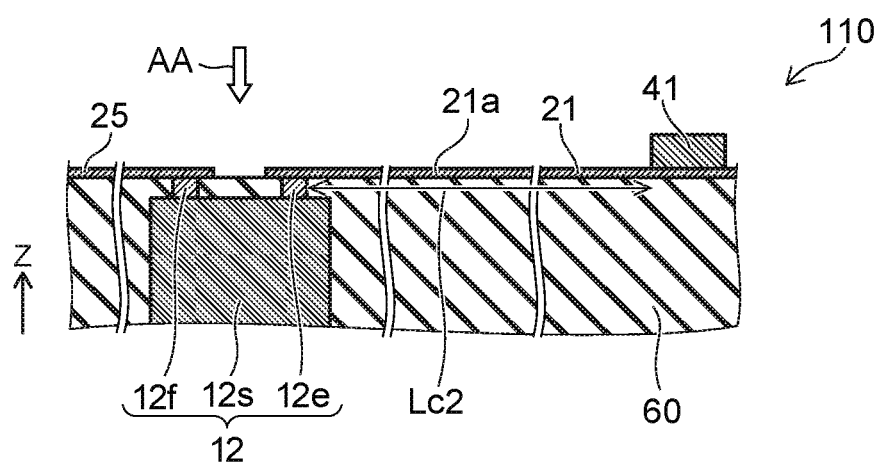
FIG. 4 is a schematic cross-sectional view showing an example of the light emitting module according to the first embodiment taken along line IV-IV in FIG. 1.

As shown in FIGS. 2 and 3, a length of the current path of the first thin film region 21a electrically connecting the first terminal part 41 and the first electrode 11e is referred to as a first current path length Lc1. As shown in FIGS. 2 and 4, a length of the current path of the second thin film region 21b electrically connecting the first terminal part 41 and the second electrode 12e is referred to as a second current path length Lc2. As shown in FIG. 2, the second current path length Lc2 is shorter than the first current path length Lc1.

As shown in FIGS. 1 to 3, the first conductive layer 31 is provided. The first conductive layer 31 is electrically connected to the first thin film region 21a. At least a portion of the first conductive layer 31 overlaps with the first thin film region 21a. For example, the plane in which the first thin film region 21a extends is referred to as an "X-Y plane". A direction perpendicular to the X-Y plane is referred to as a "first direction". The first direction is, for example, the Z-axis direction. At least a portion of the first conductive layer 31 overlaps with the first thin film region 21a in the Z-axis direction. In this example, the X-Y plane includes the first thin film region 21a and the second thin film region 21b.

With the first conductive layer 31 disposed in the first thin film region 21a where a current path is long, the electric resistance of the current path including the first thin film region 21a and the first conductive layer 31 approximates the electric resistance of the current path of the second thin film region 21b. For example, the first conductive layer 31 functions as an auxiliary wiring.

For example, a first reference example that does not include the first conductive layer 31 is considered. In the first reference example, a length of the current path between the first terminal part 41 and the first electrode 11e is different from a length of the current path between the first terminal part 41 and the second electrode 12e. Therefore, the difference in electric resistance between these current paths is great.

In contrast, in the present embodiment, the first conductive layer 31 is disposed in the first thin film region 21a having a long current path. With the first conductive layer 31, a difference in electric resistance is corrected, which allows for reducing unevenness in electric resistance. In the present embodiment, a difference between the electric resistance across the first terminal part 41 and the first electrode 11e and the electric resistance across the first terminal part 41 and the second electrode 12e can be smaller than that in the first reference example.

Reduction in a difference in electric resistance allows for reducing a difference between the current supplied to the first light emitting device 11 and the current supplied to the second light emitting device 12. This allows for reducing a difference in luminance of light emitted from these light emitting devices. According to the present, a light emitting module with improved luminance uniformity can be obtained.

On the other hand, in a second reference example, a plurality of light emitting devices are employed with wirings having widths that vary according to the difference in the current path. This structure may cause an increase of the interval between wires, so that the size of the light emitting module may be increased. Also, the resistance per wire increases, and it may be difficult to sufficiently supply the required current.

In contrast, in the present embodiment, the first conductive layer 31 is disposed to overlap with the conductive thin films 20 that function as wirings. This structure allows for narrowing the interval between the plurality of conductive thin films 20, and accordingly, for example, allows for facilitating reduction in size of the light emitting module. Also, for example, this structure allows for facilitating sufficient supply of a required current.

In the present embodiment, as described above, the first conductive layer 31 is disposed in the first thin film region 21a. In one example, the first conductive layer 31 may not be disposed in the second thin film region 21b. In another example, a conductive layer similar to the first conductive layer 31 may be disposed in the second thin film region 21b. In this case, the first conductive layer 31 disposed in the first thin film region 21a has an area greater than an area of the conductive layer disposed in the second thin film region 21b. This allows for reducing the difference in electric resistance attributed to the difference in length of current paths. For example, the first conductive layer 31 having a greater area is disposed in the first thin film region 21a, and the conductive layer having a smaller area is disposed in the second thin film region 21b. In this case, the electric resistance of the entire current path can be reduced.

In the present embodiment, the conductive thin films 20 such as the first conductive thin film 21 are preferably thin films disposed by, for example, sputtering. This allows for facilitating, for example, reducing the thickness of the light emitting module or shaping the conductive thin films 20. For example, a thin film to be the first conductive thin film 21 and others is provided to the substantially entire structure including the plurality of light emitting devices 10. Thereafter, for example, a portion of the thin film is removed by irradiation of laser light or the like. Thus, the first conductive thin film 21 and other conductive thin films 20 are provided. Alternatively, for example, after the thin film to be the conductive thin films 20 is formed, a portion of the thin film may be removed by reactive ion etching (RIE) or lift-off technique. Through these methods, a plurality of pattern thin films is obtained at high positional accuracy and high productivity. On the other hand, rigorous positional accuracy is not demanded of the first conductive layer 31. The first conductive layer 31 can be formed by, for example, thick-film printing or thin-film printing of a conductive material at high productivity.

As shown in FIG. 3, the first conductive thin film 21 has a thickness 21t smaller than a thickness 31t of the first conductive layer 31. These thicknesses are lengths in the Z-axis direction.

The thickness 21t of the first conductive thin film 21 is, for example, 10 nm or greater and 1000 nm or less. The thickness 31t of the first conductive layer 31 may be, for example, greater than 1000 nm and less than 25000 nm.

With the first conductive thin film 21 having the thickness 21t of 1000 nm or less, patterns can be easily formed with high accuracy. With the first conductive thin film 21 having the thickness 21t of 10 nm or more, for example, a uniform film can be easily obtained.

With the first conductive layer 31 having a thickness 31t greater than 1000 nm, for example, the electric resistance of the first conductive layer 31 can be reduced, and correction of the difference in electric resistance of the current paths can be facilitated. With the first conductive layer 31 having a thickness 31t less than 25000 nm, for example, a thickness of the light emitting module can be reduced.

As has been described above, the first light emitting device 11 and the fifth light emitting device 15 are connected to each other in series. As shown in FIGS. 1 and 3, the first light emitting device 11 includes an additional electrode 11f. As shown in FIG. 1, the additional electrode 11f of the first light emitting device 11 is electrically connected to the fifth light emitting device 15 via the third conductive thin film 23. For example, as shown in FIGS. 1 and 3, a portion of the third conductive thin film 23 is connected to the additional electrode 11f. As shown in FIG. 1, another portion of the third conductive thin film 23 is electrically connected to the second terminal part 42 via the fifth light emitting device 15.

As shown in FIG. 3, a gap 20g between the first conductive thin film 21 and the third conductive thin film 23 is, for example, 50 μm or less. The gap 20g corresponds to, for example, the gap between the first thin film region 21a of the first conductive thin film 21 and the third conductive thin film 23. Such reduction in a size of the gap 20g allows for, for example, establishing an appropriate connection even when a gap between the first electrode 11e of the first light emitting device 11 and additional electrode 11f is small. For example, the conductive thin films 20 can have a pattern that is appropriate for a small-size first light emitting device 11. The gap 20g is, for example, the shortest distance between the first conductive thin film 21 and the third conductive thin film 23.

In the example of the light emitting module 110, two light emitting devices 10 are connected to each other in series. In the present embodiment, any appropriate number of light emitting devices 10 may be connected in series. For example, the first electrode 11e of the first light emitting device 11 may connected to the first terminal part 41 via the first conductive thin film 21, and the additional electrode 11f of the first light emitting device 11 may be connected to the second terminal part 42 via the third conductive thin film 23 without other light emitting devices 10. That is, the third conductive thin film 23 is electrically connected to the second terminal part 42. The third conductive thin film 23 may be electrically connected to the second terminal part 42 via any appropriate number of other light emitting devices 10.

As shown in FIG. 3, the first light emitting device 11 includes a first light emitting element 11s in addition to, for example, the first electrode 11e and the additional electrode 11f. The first electrode 11e is disposed between the first light emitting element 11s and the first thin film region 21a of the first conductive thin film 21. The additional electrode 11f is disposed between the first light emitting element 11s and the third conductive thin film 23.

As shown in FIG. 3, the light emitting module 110 may further include an insulating member 60. The direction from the insulating member 60 to the first terminal part 41 extends along the Z-axis direction (first direction). The direction from the insulating member 60 to the first thin film region 21a extends along the Z-axis direction (first direction). The direction from the insulating member 60 to the first light emitting device 11 intersects the Z-axis direction (first direction). In the example of the light emitting module 110, the first thin film region 21a is located between the insulating member 60 and at least a portion of the first conductive layer 31.

For example, the first conductive thin film 21 is disposed on the insulating member 60. The first conductive layer 31 is disposed on the first thin film region 21a of the first conductive thin film 21. In this example, the first terminal part 41 is disposed on the first conductive thin film 21. As will be described below, the first thin film region 21a of the first conductive thin film 21 may be located on the first conductive layer 31.

As shown in FIG. 3, in one example of the light emitting module 110, the first terminal part 41 overlaps with the first conductive thin film 21 in the Z-axis direction (first direction). The first terminal part 41 may have a thickness 41t that is substantially the same as the thickness 31t of the first conductive layer 31. The thickness 41t may be in a range of 0.7 times or more to 1.3 times or less as great as the thickness 31t. A material substantially the same as a material of the first conductive layer 31 may be used for the first terminal part 41. The first terminal part 41 and the first conductive layer 31 may be formed simultaneously by printing or the like. This allows for obtaining the first terminal part 41 and the first conductive layer 31 at high productivity.

As shown in FIG. 4, the direction from the insulating member 60 to the second light emitting device 12 intersects the Z-axis direction (first direction). As shown in FIG. 4, the second light emitting device 12 includes, for example, in addition to the second electrode 12e, an additional electrode 12f and a second light emitting element 12s. The second electrode 12e is located between the second light emitting element 12s and the second thin film region 21b. The additional electrode 11f is located between the second light emitting element 12s and the fifth conductive thin film 25.

As shown in FIG. 1, the light emitting module 110 may further include a second conductive thin film 22 and a second conductive layer 32. In the following, a description will be given of the second conductive thin film 22 and the second conductive layer 32.

As shown in FIG. 1, the third light emitting device 13 includes a third electrode 13e and an additional electrode 13f. In the example of the light emitting module 110, the additional electrode 13f of the third light emitting device 13 is electrically connected to the first conductive thin film 21. The third light emitting device 13 is electrically connected to the first terminal part 41 via the first conductive thin film 21.

The fourth light emitting device 14 includes a fourth electrode 14e and an additional electrode 14f. In the example of the light emitting module 110, the additional electrode 14f of the fourth light emitting device 14 is electrically connected to the first conductive thin film 21. The fourth light emitting device 14 is electrically connected to the first terminal part 41 via the first conductive thin film 21.

As shown in FIG. 1, the second conductive thin film 22 includes a third thin film region 22c and a fourth thin film region 22d. The third thin film region 22c electrically connects the second terminal part 42 and the third electrode 13e. The fourth thin film region 22d electrically connects the second terminal part 42 and the fourth electrode 14e.

Figure 5:
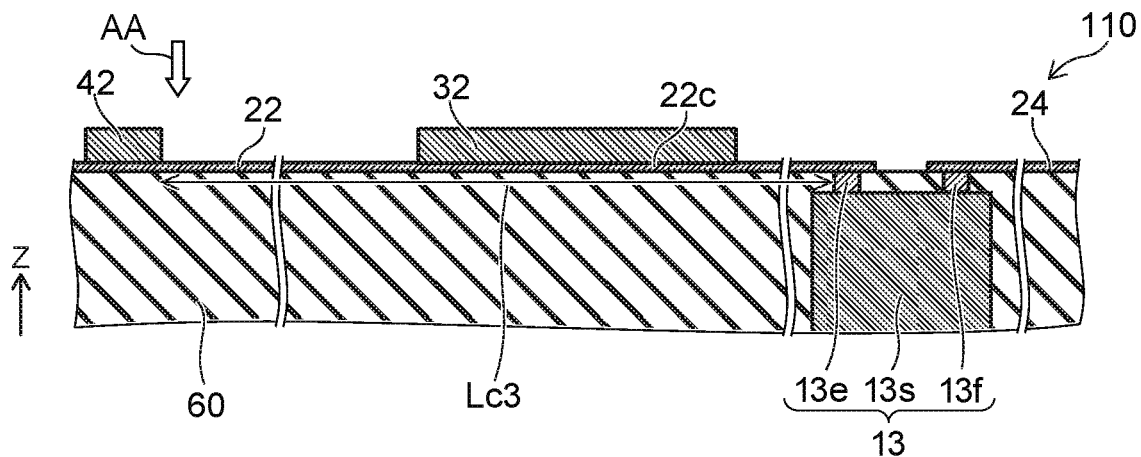
FIG. 5 is a schematic cross-sectional view showing an example of the light emitting module according to the first embodiment taken along line V-V in FIG. 1.

As shown in FIGS. 2 and 5, the third thin film region 22c has a third current path length Lc3. The third current path length Lc3 refers to a length of a current path between the second terminal part 42 and the third electrode 13e in the third thin film region 22c.

Figure 6:
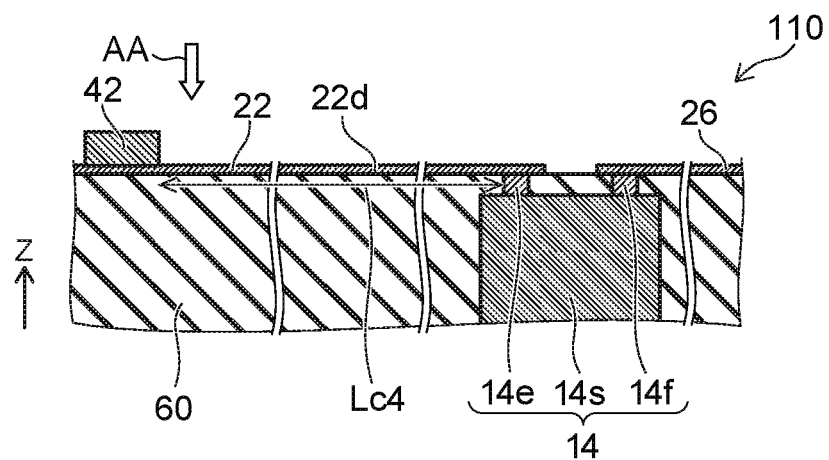
FIG. 6 is a schematic cross-sectional view showing an example of the light emitting module according to the first embodiment taken along line VI-VI in FIG. 1.

As shown in FIGS. 2 and 6, the fourth thin film region 22d has a fourth current path length Lc4. The fourth current path length Lc4 refers to a length of a current path between the second terminal part 42 and the fourth electrode 14e in the fourth thin film region 22d.

As shown in FIG. 2, the fourth current path length Lc4 is shorter than the third current path length Lc3.

The second conductive layer 32 is electrically connected to the third thin film region 22c. As shown in FIGS. 2 and 5, at least part of the second conductive layer 32 overlaps with the third thin film region 22c in the Z-axis direction (first direction).

For example, the distance between the second terminal part 42 and the third light emitting device 13 is different from the distance between the second terminal part 42 and the fourth light emitting device 14. A length of the current path between the second terminal part 42 and the third light emitting device 13 is different from a length of the current path between the second terminal part 42 and the fourth light emitting device 14. With the second conductive layer 32, the electric resistance of the current path between the second terminal part 42 and the third light emitting device 13 can be reduced.

For example, the current flowing between the second terminal part 42 and the third light emitting device 13 can be approximated to the current flowing between the second terminal part 42 and the fourth light emitting device 14. This allows for reducing the difference between a luminance of the third light emitting device 13 and a luminance of the fourth light emitting device 14. Accordingly, a light emitting module with improved luminance uniformity can be provided.

As shown in FIG. 5, the third light emitting device 13 includes, for example, in addition to the third electrode 13e and an additional electrode 13f, a third light emitting element 13s. The third electrode 13e is located between the third light emitting element 13s and the third thin film region 22c of the second conductive thin film 22. The additional electrode 13f is located between the third light emitting element 13s and the fourth conductive thin film 24.

As shown in FIG. 5, the direction from the insulating member 60 to the second terminal part 42 extends along the Z-axis direction (first direction). The direction from the insulating member 60 to the third thin film region 22c extends along the Z-axis direction (first direction). The direction from the insulating member 60 to the third light emitting device 13 intersects the Z-axis direction (first direction). In one example of the light emitting module 110, the third thin film region 22c is located between the insulating member 60 and at least a portion of the second conductive layer 32.

As shown in FIG. 6, the direction from the insulating member 60 to the fourth light emitting device 14 intersects the Z-axis direction (first direction). As shown in FIG. 6, the fourth light emitting device 14 includes, for example, in addition to the fourth electrode 14e and an additional electrode 14f, a fourth light emitting element 14s. The fourth electrode 14e is located between the fourth light emitting element 14s and the fourth thin film region 22d of the second conductive thin film 22. The additional electrode 14f is located between the fourth light emitting element 14s and the sixth conductive thin film 26.

As shown in FIG. 1, in a plan view, a group including a combination of the first light emitting device 11 and the fifth light emitting device 15, a combination of the second light emitting device 12 and the seventh light emitting device 17, a combination of the third light emitting device 13 and the sixth light emitting device 16, and a combination of the fourth light emitting device 14 and the eighth light emitting device 18 are located at an upper side with respect to a line passing through the first terminal part 41 and the second terminal part 42 in a plan view. As shown in FIG. 1, in a plan view, an additional group including other ones of the plurality of light emitting devices 10 may be located at a lower side with respect to the line passing through the first terminal part 41 and the second terminal part 42. Corresponding ones of the plurality of conductive thin films 20 are disposed also for the additional group. A conductive layer 30 is disposed on a portion of at least one of the plurality of conductive thin films 20. This structure allows for reducing unevenness in electric resistance. Accordingly, uniformity of luminance can be improved.

Second Embodiment

Figure 7:
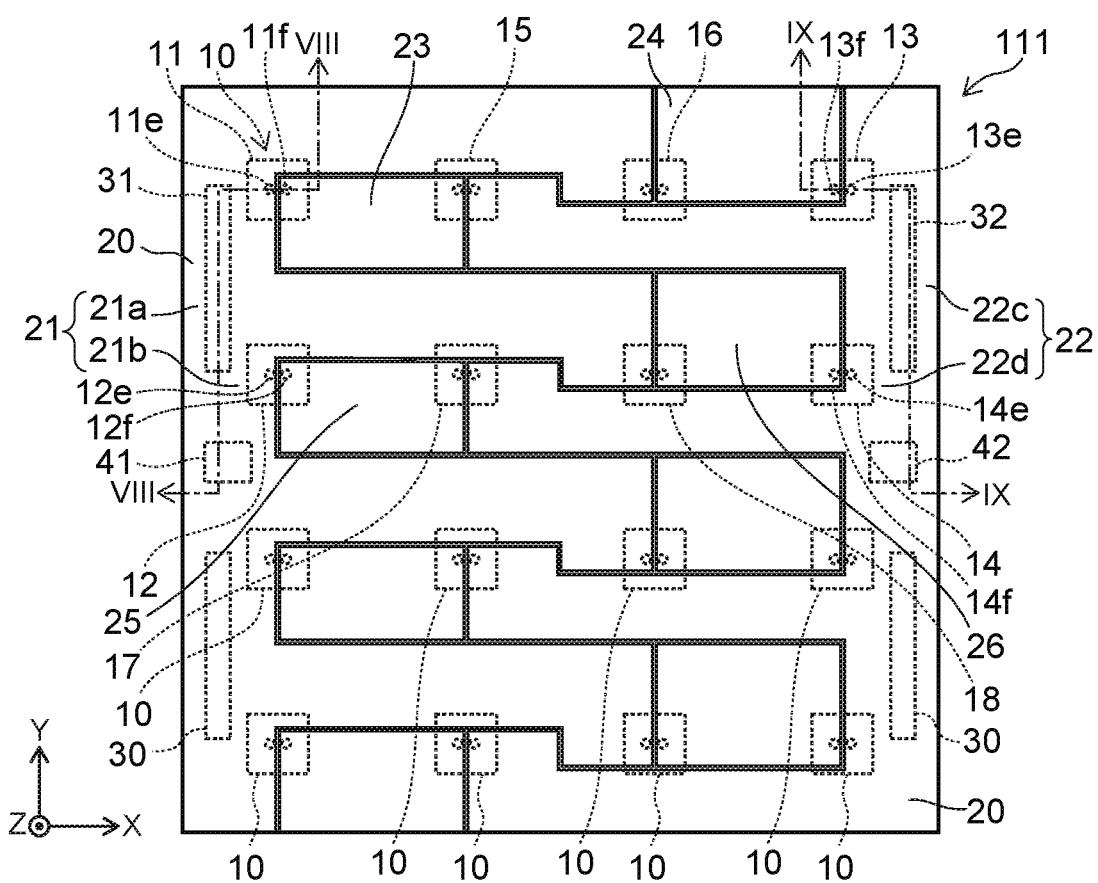
FIG. 7 is a schematic plan view showing an example of a light emitting module according to the second embodiment.

FIG. 7 is a schematic plan view showing an example of a light emitting module according to a second embodiment.

Figure 8:
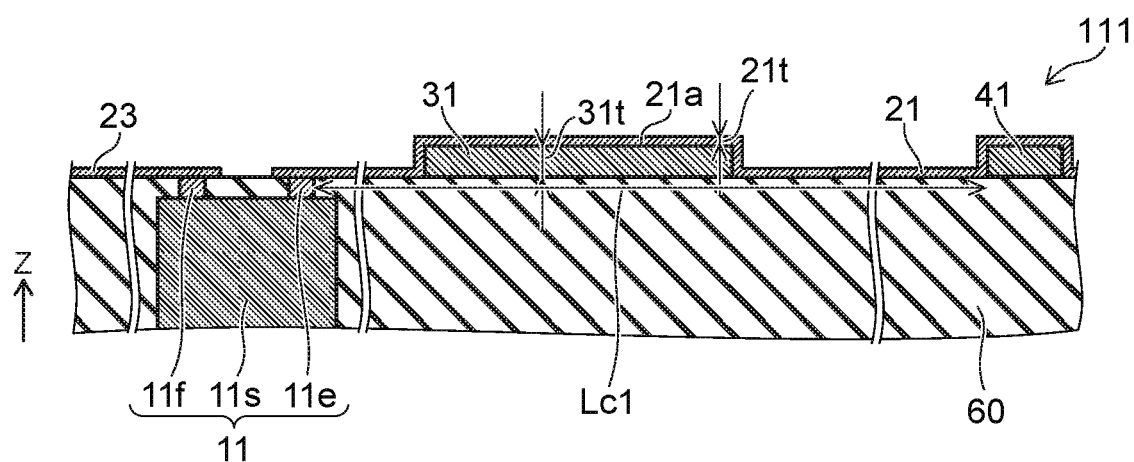
FIG. 8 is a schematic cross-sectional view showing an example of the light emitting module according to the second embodiment taken along line VIII-VIII in FIG. 7.
Figure 9:
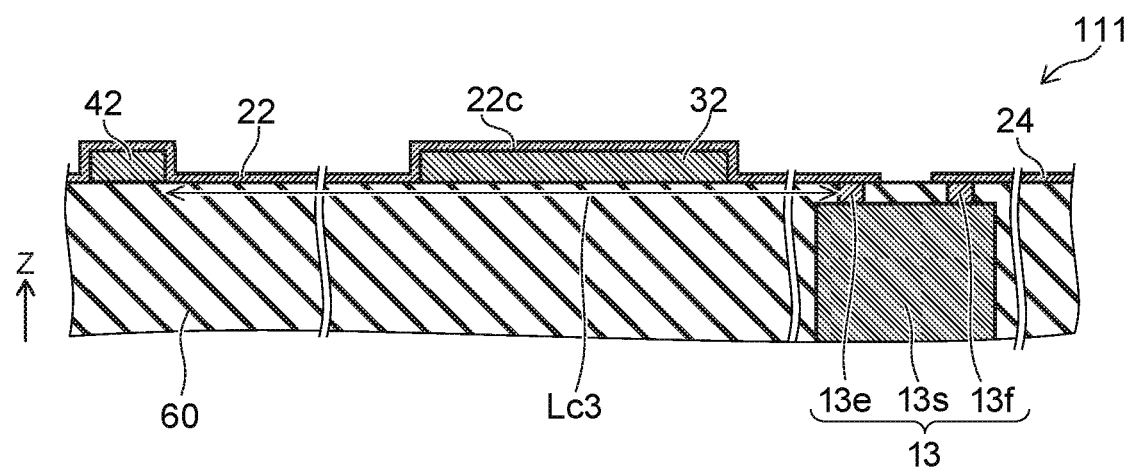
FIG. 9 is a schematic cross-sectional view showing an example of the light emitting module according to the second embodiment taken along line IX-IX in FIG. 7.

FIGS. 8 and 9 are schematic cross-sectional views showing an example of the light emitting module according to the second embodiment.

FIG. 8 is a cross-sectional view taken along line VIII-VIII in FIG. 7. FIG. 9 is a cross-sectional view taken along line IX-IX in FIG. 7.

As shown in FIGS. 7 and 8, the light emitting module 111 according to the second embodiment also includes the first terminal part 41, the first light emitting device 11, the second light emitting device 12, the third light emitting device 13, the fourth light emitting device 15, the first conductive thin film 21, the second conductive thin film 22, the first conductive layer 31, the second conductive layer 32, and the insulating member 60. The light emitting module 111 is different from the light emitting module 110 in the layering order of the first conductive thin film 21 and the first conductive layer 31, and that of the second conductive thin film 22 and the second conductive layer 32. The configuration of the light emitting module 111 is otherwise similar to, for example, that of the light emitting module 110.

As shown in FIG. 8, the first conductive layer 31 is disposed on the insulating member 60, and the first thin film region 21a is disposed on the first conductive layer 31. In this example, the first conductive thin film 21 is disposed on the first terminal part 41. As shown in FIG. 9, the second conductive layer 32 is disposed on the insulating member 60, and the third thin film region 22c is disposed on the second conductive layer 32. In this example, the second conductive thin film 22 is disposed on the second terminal part 42.

As described above, at least a portion of the first conductive layer 31 may be disposed between the insulating member 60 and the first thin film region 21a. At least a portion of the second conductive layer 32 may be disposed between the insulating member 60 and the third thin film region 22c.

In the light emitting module 110 exemplarily shown in FIG. 3, the first conductive thin film 21 is disposed on a flat surface. This structure can facilitate obtaining the first conductive thin film 21 having a uniform thickness. Accordingly, for example, good adhesion between the insulating member 60 and the first conductive thin film 21 can be easily obtained. In the light emitting module 111 exemplarily shown in FIG. 7, the first conductive layer 31 is disposed on a flat surface. This structure allows for facilitating obtaining the first conductive layer 31 having a uniform thickness. Accordingly, for example, good adhesion between the insulating member 60 and the first conductive layer 31 can be easily obtained.

Third Embodiment

Figure 10:
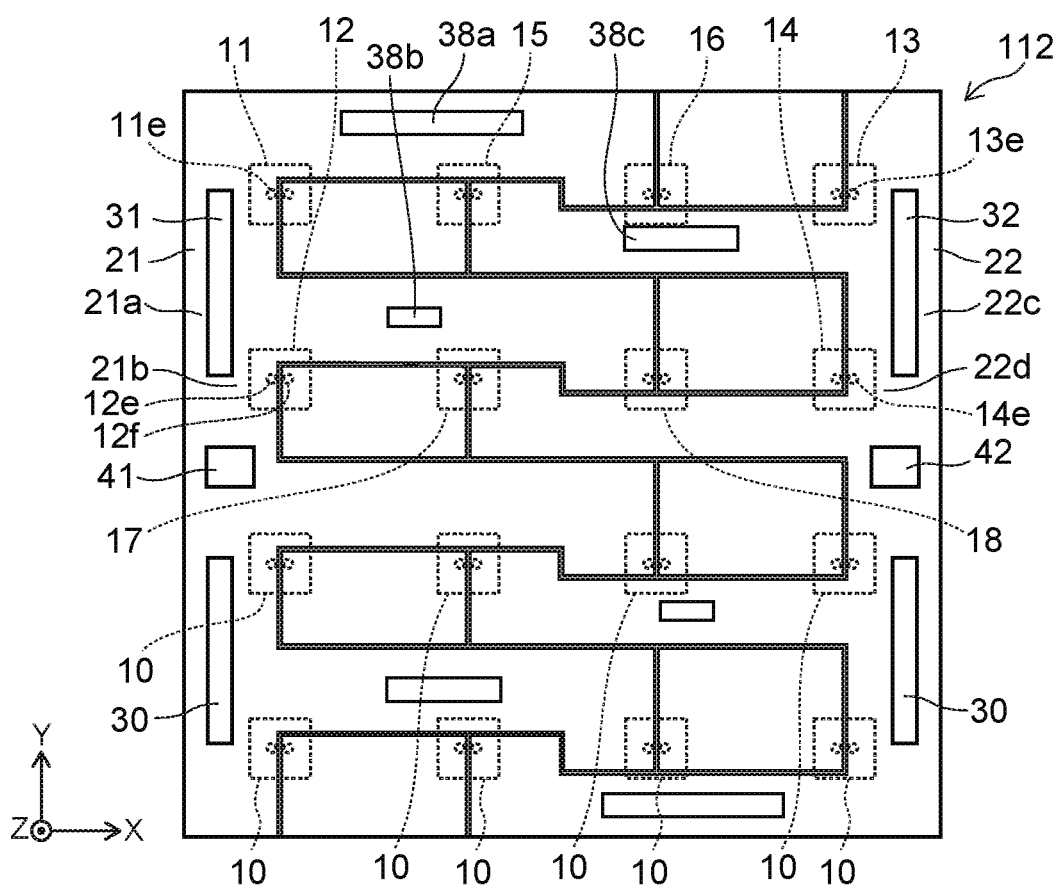
FIG. 10 is a schematic plan view showing an example of a light emitting module according to a third embodiment.

FIG. 10 is a schematic plan view showing an example of a light emitting module according to a third embodiment.

FIG. 10 is a schematic plan view corresponding to FIG. 1.

As shown in FIG. 10, the light emitting module 112 according to the third embodiment includes, in addition to the first conductive layer 31 and the second conductive layer 32, additional conductive layers 38a to 38c, etc. The conductive layer 38a is disposed on a region of the first conductive thin film 21 connected to the sixth light emitting device 16. The conductive layer 38b is disposed on a region of the first conductive thin film 21 connected to the eighth light emitting device 18. The conductive layer 38c is disposed on a region of the second conductive thin film 22 connected to the fifth light emitting device 15. The configuration of the light emitting module 112 is otherwise similar to, for example, the configuration of the light emitting module 110. In the light emitting module 112, electric resistance can be reduced in the current path between the first terminal part 41 and the sixth light emitting device 16, in the current path between the first terminal part 41 and the eighth light emitting device 18, and in the current path between the second terminal part 42 and the fifth light emitting device 15. The light emitting module 112 can have improved luminance uniformity.

Fourth Embodiment

Figure 11:
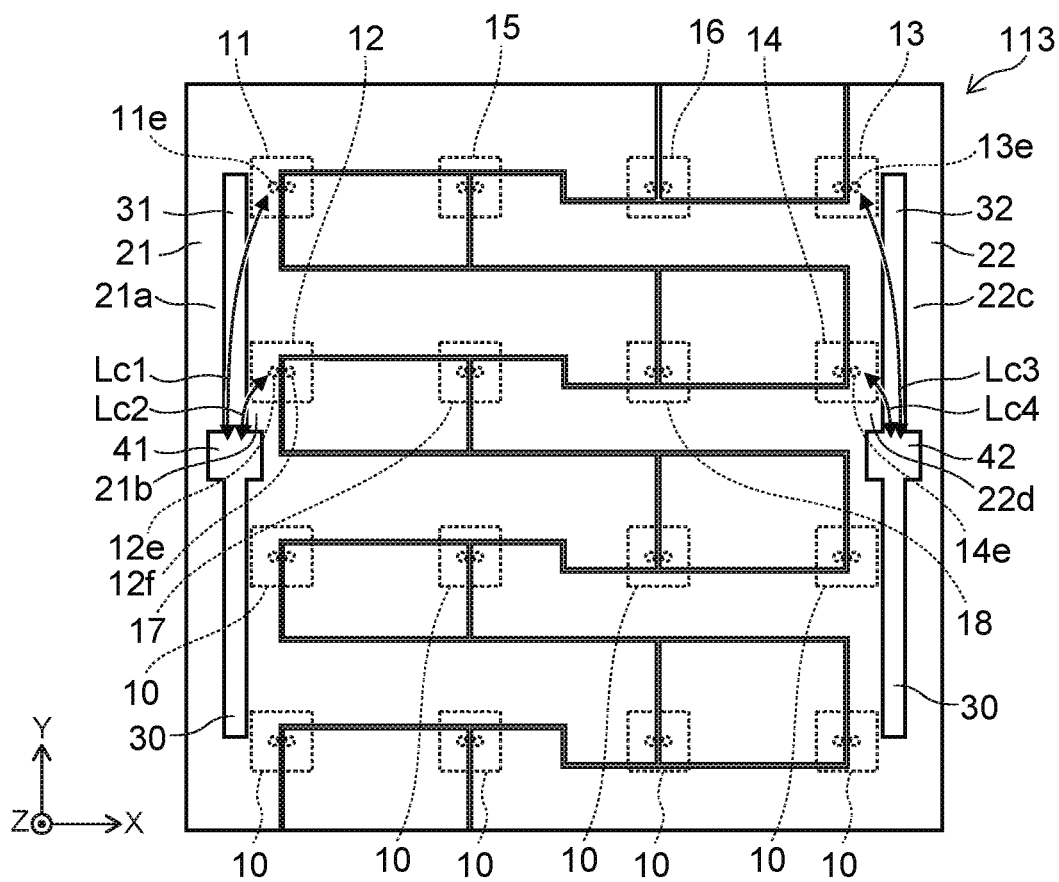
FIG. 11 is a schematic plan view showing an example of a light emitting module according to a fourth embodiment.

FIG. 11 is a schematic plan view showing an example of a light emitting module according to a fourth embodiment.

FIG. 11 is a schematic plan view corresponding to FIG. 1.

As shown in FIG. 11, in the light emitting module 113 according to the fourth embodiment, the first conductive layer 31 is continuous to the first terminal part 41. A portion of the first conductive layer 31 overlaps with a portion of the current path between the first terminal part 41 and the first electrode 11e. Another portion of the first conductive layer 31 may overlap with a portion of the current path between the first terminal part 41 and the second electrode 12e. The configuration of the light emitting module 113 is otherwise similar to, for example, the configuration of the light emitting module 110. With the first conductive layer 31, a difference between the electric resistance across the first terminal part 41 and the second electrode 12e and the electric resistance across the first terminal part 41 and the first electrode 11e can be reduced as compared to the configuration without the first conductive layer 31. In the light emitting module 113, the second conductive layer 32 is continuous to the second terminal part 42. With the second conductive layer 32, a difference between the electric resistance across the second terminal part 42 and the third electrode 13e and the electric resistance across the second terminal part 42 and the fourth electrode 14e can be reduced, as compared to the configuration without the second conductive layer 32. The light emitting module 113 can have improved luminance uniformity.

Fifth Embodiment

Figure 12:
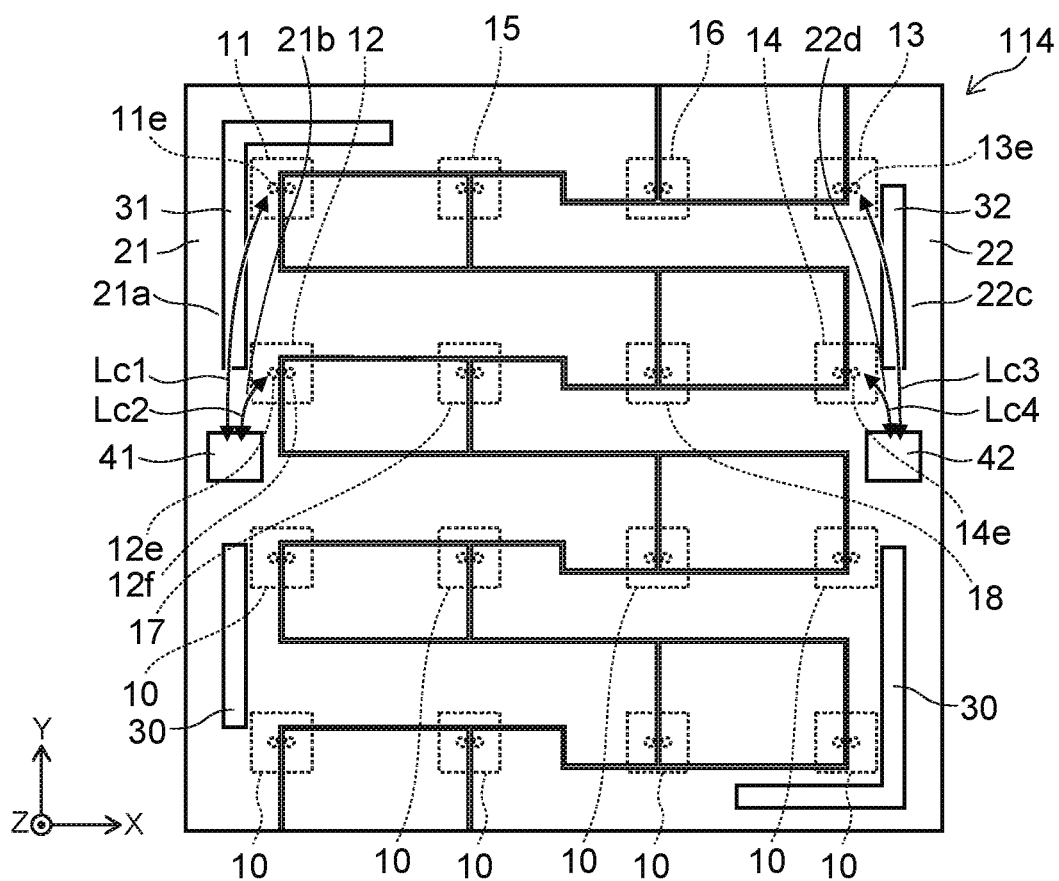
FIG. 12 is a schematic plan view showing an example of a light emitting module according to a fifth embodiment.

FIG. 12 is a schematic plan view showing an example of a light emitting module according to a fifth embodiment.

FIG. 12 is a schematic plan view corresponding to FIG. 1.

As shown in FIG. 12, in a light emitting module 114 according to the fifth embodiment, the first conductive layer 31 includes a portion extending along a first side of the light emitting module 114, and a portion extending along a second side of the light emitting module 114. A direction of the first side intersects a direction of the second side. The configuration of the light emitting module 114 is otherwise similar to, for example, the configuration of the light emitting module 110. Such a first conductive layer 31 allows for reducing difference between the electric resistance across the first terminal part 41 and the first electrode 11e and the electric resistance across the first terminal part 41 and the second electrode 12e. Also, such a first conductive layer 31 allows for reducing difference between the electric resistance across the first terminal part 41 and the electrode of the sixth light emitting device 16 and the electric resistance across the first terminal part 41 and the second electrode 12e. The light emitting module 114 can have improved luminance uniformity.

The configuration of the light emitting module 111 is applicable to the light emitting modules 112 to 114.

Sixth Embodiment

Figure 13:
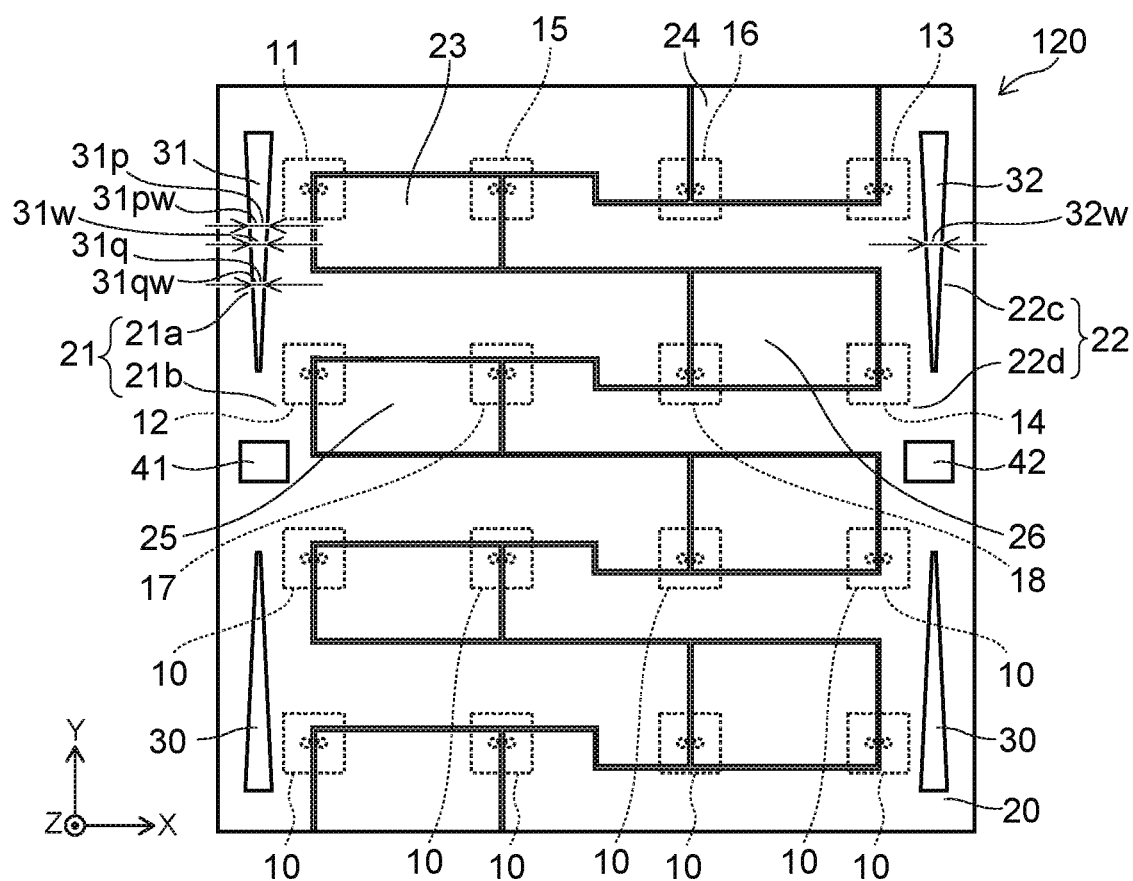
FIG. 13 is a schematic plan view showing an example of a light emitting module according to a sixth embodiment.

FIG. 13 is a schematic plan view showing an example of a light emitting module according to a sixth embodiment.

FIG. 13 is a schematic plan view corresponding to FIG. 1.

As shown in FIG. 13, a light emitting module 120 according to the sixth embodiment includes the first terminal part 41, the first light emitting device 11, the second light emitting device 12, the first conductive thin film 21, and the first conductive layer 31. The first conductive layer 31 according to the light emitting module 120 has a planar shape different from a planar shape of the first conductive layer 31 in the light emitting module 110. The configuration of the light emitting module 120 is otherwise similar to, for example, the configuration of the light emitting module 110. One example of the planar shape of the first conductive layer 31 will be described below.

As shown in FIG. 13, the first conductive layer 31 a width 31w increases in a direction from the first terminal part 41 toward the first electrode 11e, in the current path between the first terminal part 41 and the first electrode 11e. The width 31w of the first conductive layer 31 refers to a length of the first conductive layer 31 extending in a direction perpendicular to a direction of the current path between the first terminal part 41 and the first electrode 11e. For example, the width 31w of the first conductive layer 31 increases in a direction in which the distance from the first terminal part 41 increases. Such a first conductive layer 31 allows for facilitating correction of difference in electric resistance. Accordingly, further improvements in luminance uniformity can be facilitated.

For example, as shown in FIG. 13, the first conductive layer 31 includes a first portion 31p and a second portion 31q. A distance between the first portion 31p and the first terminal part 41 along the current path between the first terminal part 41 and the first electrode 11e is greater than the distance between the second portion 31q and the first terminal part 41 along the current path between the first terminal part 41 and the first electrode 11e. For example, the distance between the first portion 31p and the first terminal part 41 is greater than the distance between the second portion 31q and the first terminal part 41. The first portion 31p is far from the first terminal part 41, and the second portion 31q is close to the first terminal part 41. The first portion 31p has a first width 31pw along a first width direction wider than a second width 31qw of the second portion 31q along a second width direction. In this example, the first width direction and the second width direction are the X-axis direction.

The first width direction is perpendicular to the Z-axis direction (first direction). The first width direction intersects, for example, a direction, at the first portion 31p, in which a current flows through the current path between the first terminal part 41 and the first electrode 11e. The second width direction is perpendicular to the Z-axis direction (first direction). The second width direction intersects, for example, a direction, at the second portion 31q, in which the current flows. The first width direction and the second width direction may be practically perpendicular to the extending direction of the first conductive layer 31. In this example, the first width direction and the second width direction are along the X-axis direction.

As shown in FIG. 13, in the current path between the second terminal part 42 and the third electrode 13e, the width 32w of the second conductive layer 32 increases in a direction from the second terminal part 42 to the third electrode 13e. The width 32w of the second conductive layer 32 refers to a length of the second conductive layer 32 along a direction perpendicular to the direction of the current path between the second terminal part 42 and the third electrode 13e. For example, the width 32w of the second conductive layer 32 increases in a direction in which distance from the second terminal part 42 increases. Such a second conductive layer 32 allows for facilitating correction of difference in electric resistance, and accordingly allows for facilitating further improvement in luminance uniformity.

The configuration of the light emitting modules 111 to 114 is applicable to the light emitting module 120.

Seventh Embodiment

Figure 14:
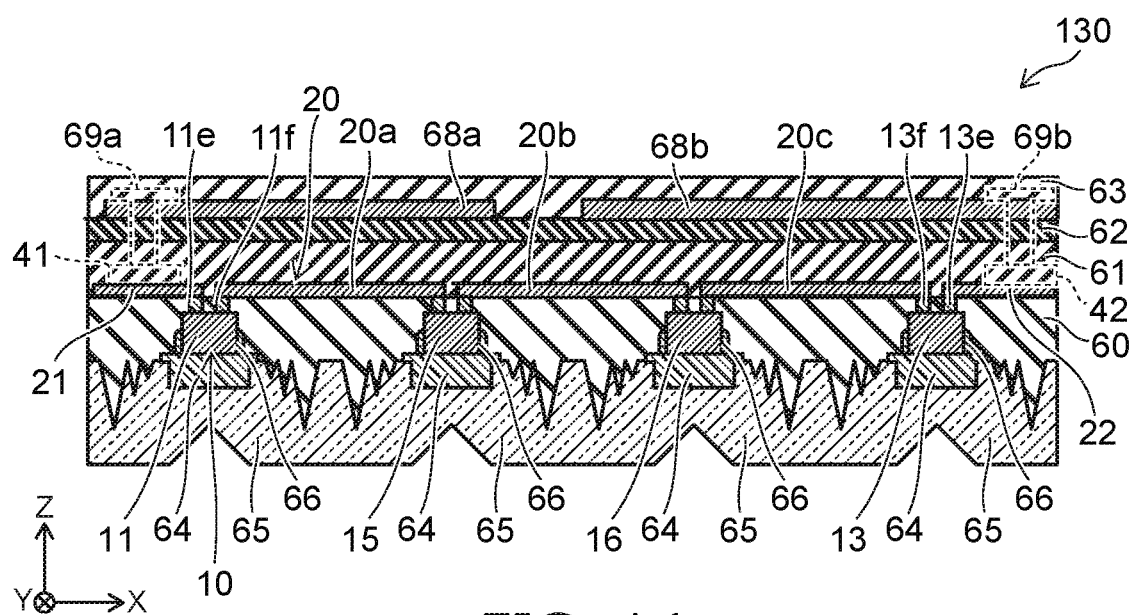
FIG. 14 is a schematic cross-sectional view showing an example of a light emitting module according to a seventh embodiment.

FIG. 14 is a schematic cross-sectional view showing an example of a light emitting module according to a seventh embodiment.

As shown in FIG. 14, a light emitting module 130 according to the seventh embodiment includes a plurality of light emitting devices 10, a plurality of conductive thin films 20, the first terminal part 41, and the second terminal part 42. In the cross-section shown in FIG. 14, actually, the first terminal part 41 and the second terminal part 42 do not appear. The first terminal part 41 and the second terminal part 42 are disposed at, for example, locations exemplarily shown in FIG. 1. The light emitting module 130 includes the first conductive layer 31 and the second conductive layer 32. These conductive layers do not appear in the cross-section shown in FIG. 14. The first conductive layer 31 and the second conductive layer 32 in the light emitting module 130 may be similar to the first conductive layer 31 and the second conductive layer 32, respectively, in the light emitting modules 110 to 114 or the light emitting module 120.

In the light emitting module 130, the plurality of light emitting devices 10 includes the first light emitting device 11, the third light emitting device 13, the fifth light emitting device 15, and the sixth light emitting device 16. The plurality of conductive thin films 20 includes the first conductive thin film 21, the second conductive thin film 22, and the conductive thin films 20a to 20c. In this example, the light emitting devices 10 are connected in series by the conductive thin films 20a to 20c. In one example, the first light emitting device 11 is located at one end of an array of the plurality of light emitting devices 10, and is electrically connected to the first terminal part 41 via the first conductive thin film 21. Further, the third light emitting device 13 is located at another end of the array of the plurality of light emitting devices 10, and is electrically connected to the second terminal part 42 via the second conductive thin film 22. In the light emitting module 130, the plurality of light emitting devices 10 may include the second light emitting device 12 exemplarily shown in FIG. 1.

In the example shown in FIG. 14, wiring layers 68a and 68b are disposed on the plurality of conductive thin films 20 via insulating films 61 and 62. The wiring layer 68a and the first terminal part 41 are electrically connected by the connecting member 69a. The wiring layer 68b and the second terminal part 42 are electrically connected by the connecting member 69b. An insulating film 63 is disposed on the wiring layers 68a and 68b.

In the example shown in FIG. 14, each of the plurality of light emitting devices 10 is connected to a corresponding one of wavelength conversion members 64 via a corresponding one of light-transmissive members 66. Each of the wavelength conversion members 64 is disposed between a corresponding portion of an optical member 65 and a corresponding one of the plurality of light emitting devices 10. The optical members 65 function as, for example, lenses. Light emitted from the plurality of light emitting devices 10 passes through the wavelength conversion members 64 and the optical members 65 and is emitted to the outside.

In the light emitting module 130, the first conductive layer 31 and the second conductive layer 32 allow for improving luminance uniformity. In certain embodiments, a plurality of light emitting modules having configurations as described above may be employed.

In the first to seventh embodiments, the conductive thin film (for example, at least one of the first to sixth conductive thin films 21 to 26) contains at least one selected from the group consisting of Cr, Cu, Ni, Ag, Ti, Au, Pt, Pd, Rh, and Ru. The conductive thin film may be formed of at least one selected from the group consisting of Cr, Cu, Ni, Ag, Ti, Au, Pt, Pd, Rh, and Ru. The conductive thin film may be formed of a plurality of metal layers containing at least one selected from the group consisting of Cr, Cu, Ni, Ag, Ti, Au, Pt, Pd, Rh, and Ru. The conductive thin film may contain alloy containing at least one selected from the group consisting of Cr, Cu, Ni, Ag, Ti, Au, Pt, Pd, Rh, and Ru. The conductive thin film may be formed of alloy containing at least one selected from the group consisting of Cr, Cu, Ni, Ag, Ti, Au, Pt, Pd, Rh, and Ru.

In the first to seventh embodiments, the conductive layer (for example, at least one of the first and second conductive layers 31 and 32) contains at least one selected from the group consisting of Cu, Ag, Ni, Au, Zn, and Sn. The conductive layer may be formed of at least one selected from the group consisting of Cu, Ag, Ni, Au, Zn, and Sn. The conductive layer may be formed of a plurality of metal layers containing at least one selected from the group consisting of Cu, Ag, Ni, Au, Zn, and Sn. The conductive layer may contain at least one alloy selected from the group consisting of Cu, Ag, Ni, Au, Zn, and Sn. The conductive layer may be formed of at least one alloy selected from the group consisting of Cu, Ag, Ni, Au, Zn, and Sn.

In the first to seventh embodiments, two terminal parts are provided. In certain embodiments, three or more terminal parts may be employed. Also when employing three or more terminal parts, with the conductive layer disposed at a location at which difference in length of a path of current flowing between each terminal part and a corresponding light emitting device occurs, a difference in electric resistance attributed to the difference in current path length can be reduced.

According to one embodiment, a light emitting module with improved luminance uniformity can be obtained.

While certain embodiments of the present disclosure have been described above with reference to specific examples, the scope of the present invention is not limited to these specific examples. For example, specific configuration of each of the terminal parts, the light emitting devices, the electrodes, the light emitting elements, the conductive thin films, and the conductive layers included in the light emitting module can be selected from known configurations, and such configurations are within the scope of the present invention so long as the person skilled in the art can similarly implement the present invention to obtain similar effect.

Further, combination of components in two or more specific examples are also within the scope of the present invention, to a technically possible extent, so long as they possess the spirit of the present disclosure.

Still further, light emitting modules subjected to an appropriate design change from the light emitting module in embodiments of the present disclosure described above are also within the scope of the present invention so long as they possesses the spirit of the present invention.

Furthermore, a person of ordinary skill in the art will appreciate various changes and modifications within the scope of the idea of the present invention. Such changes and modifications should also be construed to be within the scope of the present invention.

The present disclosure is applicable to, for example, a light source for a backlight device, a light source for an illumination device, a light source for a display device, etc.

What is claimed is:

1. A light emitting module comprising:
a first terminal part;
a first light emitting device comprising a first electrode;
a second light emitting device comprising a second electrode;
a first conductive thin film comprising:
a first thin film region electrically connecting the first terminal part and the first electrode and having a first current path length, and
a second thin film region electrically connecting the first terminal part and the second electrode and having a second current path length shorter than the first current path length; and
a first conductive layer electrically connected to the first thin film region;
wherein at least a portion of the first conductive layer overlaps with the first thin film region in a first direction that is perpendicular to a plane in which the first thin film region extends.

2. The light emitting module according to claim 1, wherein:
a thickness of the first conductive thin film is smaller than a thickness of the first conductive layer.

3. The light emitting module according to claim 2, wherein:
the thickness of the first conductive thin film is 10 nm or greater and 1000 nm or less; and
the thickness of the first conductive layer is greater than 1000 nm and less than 25000 nm.

4. The light emitting module according to claim 2, wherein:
the first terminal part overlaps with the first conductive thin film; and
a thickness of the first terminal part is substantially the same as the thickness of the first conductive layer.

5. The light emitting module according to claim 3, wherein:
the first terminal part overlaps with the first conductive thin film; and
a thickness of the first terminal part is substantially the same as the thickness of the first conductive layer.

6. The light emitting module according to claim 1, wherein:
a material of the first terminal part is substantially the same as a material of the first conductive layer.

7. The light emitting module according to claim 1, wherein:
the first conductive thin film contains at least one selected from the group consisting of Cr, Cu, Ni, Ag, Ti, Au, Pt, Pd, Rh, and Ru; and
the first conductive layer contains at least one selected from the group consisting of Cu, Ag, Ni, Au, Zn, and Sn.

8. The light emitting module according to claim 1, wherein:
a width of the first conductive layer along a direction perpendicular to a direction of a current path between the first terminal part and the first electrode increases in a direction from the first terminal part to the first electrode in the current path between the first terminal part and the first electrode.

9. The light emitting module according to claim 1, wherein:
the first conductive layer comprises a first portion and a second portion,
a distance between the first portion and the first terminal part along a current path between the first terminal part and the first electrode is greater than a distance between the second portion and the first terminal part along the current path between the first terminal part and the first electrode; and
when a first width direction is defined as a direction perpendicular to the first direction and intersecting a direction of a current flowing through the current path between the first terminal part and the first electrode at the first portion, and a second width direction is defined as a direction perpendicular to the first direction and intersecting a direction of the current flowing through the current path between the first terminal part and the first electrode at the second portion, a first width of the first portion along the first width direction is greater than a second width of the second portion along the second width direction.

10. The light emitting module according to claim 1, further comprising:
a second terminal part;
a third light emitting device comprising a third electrode;
a fourth light emitting device comprising a fourth electrode;
a second conductive thin film comprising:
  a third thin film region electrically connecting the second terminal part and the third electrode and having a third current path length, and
  a fourth thin film region electrically connecting the second terminal part and the fourth electrode and having a fourth current path length shorter than the third current path length; and
a second conductive layer electrically connected to the third thin film region;
wherein at least a portion of the second conductive layer overlaps with the third thin film region in the first direction.

11. The light emitting module according to claim 1, further comprising:
a second terminal part; and
a third conductive thin film,
wherein the first light emitting device further comprises an additional electrode;
wherein a first portion of the third conductive thin film is connected to the additional electrode; and
wherein a second portion of the third conductive thin film is electrically connected to the second terminal part.

12. The light emitting module according to claim 11, further comprising
a fifth light emitting device;
wherein the third conductive thin film is electrically connected to the second terminal part via the fifth light emitting device.

13. The light emitting module according to claim 12, wherein:
a gap between the first conductive thin film and the third conductive thin film is 50 µm or less.

14. The light emitting module according to claim 12, wherein:
a gap between the first conductive thin film and the third conductive thin film is 50 µm or less.

15. The light emitting module according to claim 1, further comprising:
an insulating member,
wherein a direction from the insulating member to the first terminal part is along the first direction;
wherein a direction from the insulating member to the first thin film region is along the first direction;
wherein a direction from the insulating member to the first light emitting device intersects the first direction; and
wherein (i) the first thin film region is located between the insulating member and the at least a portion of the first conductive layer, or (ii) the at least a portion of the first conductive layer is located between the insulating member and the first thin film region.

* * * * *